United States Patent
Wiser et al.

(10) Patent No.: US 11,935,587 B2
(45) Date of Patent: Mar. 19, 2024

(54) DYNAMIC ADJUSTMENT OF WORDLINE TIMING IN STATIC RANDOM ACCESS MEMORY

(71) Applicant: Ceremorphic, Inc., San Jose, CA (US)

(72) Inventors: Robert F. Wiser, Santa Cruz, CA (US); Neelam Surana, Palaj (IN)

(73) Assignee: Ceremorphic, Inc., San Jose, CA (US)

( * ) Notice: Subject to any disclaimer, the term of this patent is extended or adjusted under 35 U.S.C. 154(b) by 136 days.

(21) Appl. No.: 17/555,501

(22) Filed: Dec. 19, 2021

(65) Prior Publication Data

US 2023/0197146 A1 Jun. 22, 2023

(51) Int. Cl.
*G11C 11/418* (2006.01)
*G11C 8/08* (2006.01)
*G11C 11/419* (2006.01)

(52) U.S. Cl.
CPC ............. *G11C 11/418* (2013.01); *G11C 8/08* (2013.01); *G11C 11/419* (2013.01)

(58) Field of Classification Search
CPC ............... G11C 11/418; G11C 11/419; G11C 2029/1202; G11C 11/413; G11C 29/021; G11C 29/50012; G11C 8/08; G11C 29/028; G11C 29/4401
See application file for complete search history.

(56) References Cited

U.S. PATENT DOCUMENTS

| 7,516,280 | B1 | 4/2009 | Rezeanu |
| 2002/0159285 | A1 | 10/2002 | Morley et al. |
| 2006/0176743 | A1 | 8/2006 | Bunce et al. |
| 2013/0176784 | A1 | 7/2013 | Cometti et al. |
| 2013/0301335 | A1 | 11/2013 | Ong |
| 2016/0099059 | A1 | 4/2016 | Chen et al. |
| 2016/0148680 | A1 | 5/2016 | Yoshimoto et al. |
| 2019/0392876 | A1* | 12/2019 | Katoch ............ G11C 7/22 |

FOREIGN PATENT DOCUMENTS

KR     20200045625 A  *  5/2020  ......... G11C 11/413

OTHER PUBLICATIONS

Search Report, PCT/US2022/053414.
Yang et al "A double sensing scheme with selective bitline voltage regulation for ultralow voltage iming speculative SRAM", IEEE Jounral of Solid-State Circuits 53.8 (2018) p. 2415-2426.

* cited by examiner

*Primary Examiner* — Jay W. Radke
(74) *Attorney, Agent, or Firm* — File-EE-Patents.com; Jay A. Chesavage

(57) ABSTRACT

A static random access memory (SRAM) has one or more arrays of memory cells, each array of memory cells activated in columns by a wordline. The activated column of memory cells asserts output data onto a plurality of bitlines coupled to output drivers. The SRAM includes a wordline controller generating a variable wordline signal pulse width which may be reduced sufficiently to introduce memory read errors. Each of a high error rate, medium error rate, low error rate, and a nearly error-free rate is associated with a pulse width value generated by the wordline controller. A power consumption tradeoff exists between the wordline signal pulse width and consumed SRAM power. The wordline controller is thereby able to associate a wordline signal pulse width with an associated error rate for performing tasks which are insensitive to a high error rate or a medium error rate, which are specific to certain neural network training and inference using various NN data types.

17 Claims, 4 Drawing Sheets

Wordline Pulse Width/Error Rate Association Flowchart

Memory Cell Array with Longest Wordline Signal Path

Memory Cell Array with Shortest Wordline Signal Path

Figure 2
Word Line Waveform vs Address Accessed
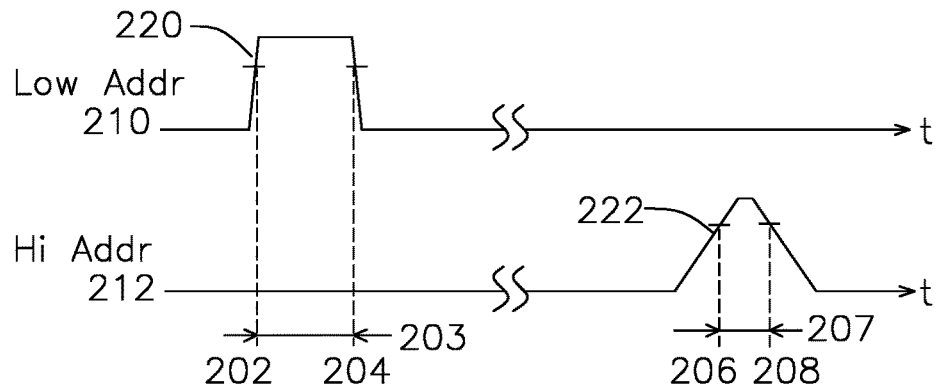
Figure 3
Wordline/Dataline Delay vs Address
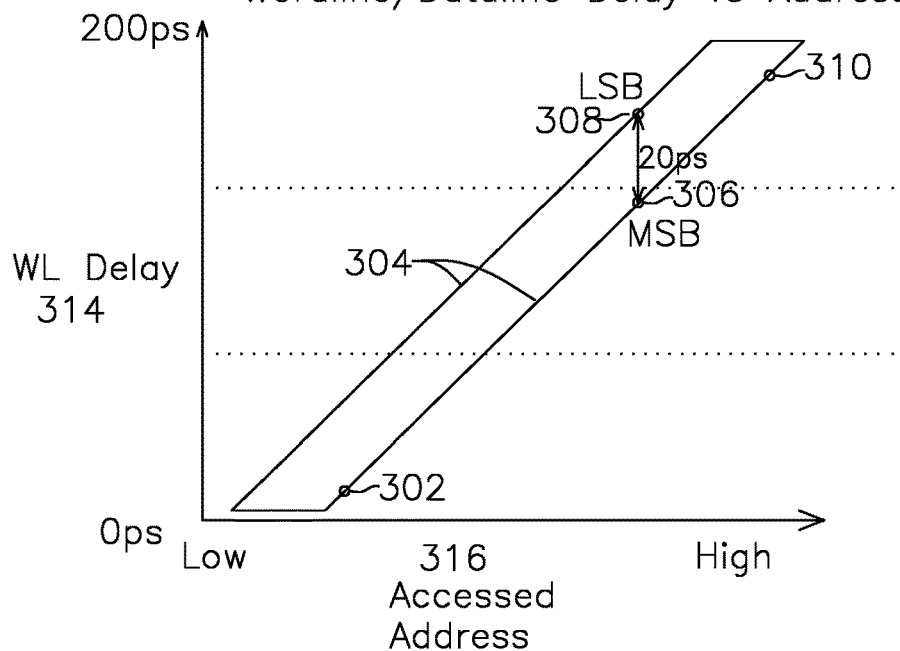
Figure 4
Case 1: high bit error tolerable ~10%MSB (training NN w/lg dataset)
Case 2: moderate bit error rate ~1% MSB (audio NN)
Case 3: low bit error rate ~0.1% MSB errors acceptable (Imagenet NN)
Case 4: no errors tolerable (<~0.00034%)

Wordline Pulse Width Controller

Wordline Pulse Width/Error Rate Association Flowchart

DYNAMIC ADJUSTMENT OF WORDLINE TIMING IN STATIC RANDOM ACCESS MEMORY

FIELD OF THE INVENTION

The present invention relates to a controller for a Static Random Access Memory (SRAM). In particular, the invention relates to adjustment of timing in an SRAM to provide reduced power consumption by use of a minimum wordline signal pulse width on a data processing application specific basis.

BACKGROUND OF THE INVENTION

A chip layout for a Static Random Access Memory (SRAM) is typically arranged having a memory cell region comprising an array of memory cells for storing data, Input/Output (I/O) logic providing data input and output interfaces, and controller logic performing address decoding to enable memory cells of a selected column of memory cells in the memory cell array. When retrieving data from an SRAM, the controller causes a wordline signal to be activated, the activated wordline comprising a horizontal wordline connected to a vertical wordline which activates a vertical column of memory cells of the memory cell array, and the data from a selected vertical column of activated memory cells is transferred on a plurality of horizontal bitlines to the I/O logic and to output pins of the SRAM. The example vertical and horizontal components of the wordlines and horizontal bitlines, respectively, are arbitrary orientations for explanation purposes. A memory cell associated with a shortest length wordline signal path from a controller and a shortest length bitline from a memory cell has an access time which is faster than a memory cell associated with a longest length wordline signal path from the controller and a longest length bitline from a memory cell.

In prior art SRAM applications, the SRAM data is typically clocked through a series of pipeline stages. In these applications, the speed of the system is established by the slowest element response time, which establishes the clocking rate for the memory system. Further, these prior art data SRAM applications typically rely on error-free data accuracy, since the data being handled may be CPU instructions or data whose accuracy must be fully preserved when reading and writing, and having very low introduced error rates is not only essential, but the subject of many error detection and correction methods to ensure very high data accuracy.

A new type of processing system used in artificial intelligence networks and information processing architectures is known as a Neural Network (NN), and does not have these error-free data processing constraints. In certain NN applications, the data is handled asynchronously in independent stages, and does not rely on pipeline stage processing with fixed pipeline stage processing times governed by a system clock. Additionally, in certain processing applications such as image processing, because of the vast amount of data being processed by the NN, and the inherent random noise already present in the data, these NN applications may not require a high degree of accuracy in reading data, and are insensitive to random additional errors introduced by memory data retrieval errors with a noise variance smaller than the noise variance of the data used for training or inference. In other NN applications, the data precision requirement is low, and only the high order (most significant) bits of data are important or in use, and the low order (least significant) bits of data may be corrupted or lost without loss of accuracy of the inferences formed by the NN processor. However, prior art SRAMs do not provide flexibility in accuracy, but may have higher power consumption, neither of which would be helpful in certain neural network data processing applications.

A new memory architecture is desired which provides the ability to trade off memory access time with accuracy of retrieved data and power consumption, and to provide an arrangement of data in the memory array which provides incrementally greater accuracy for most significant bit data than for least significant bit data.

OBJECTS OF THE INVENTION

A first object of the invention is a memory array which provides a shorter wordline signal path from a controller for most significant bits (MSB) of a memory word than that for least significant bits (LSB) of the memory word, wherein a word is 16 bits or 32 bits, for example.

A second object of the invention is a memory array comprising:
a top memory cell array accessed by activating a wordline signal path which causes the top memory cell array to output data onto one or more top bitlines;
a bottom memory cell array accessed by activating a wordline signal path which causes bottom memory cell array to output data onto one or more bottom bitlines;
a wordline controller configured to examine output data from the one or more bitlines, the wordline controller modifying a wordline signal pulse width until on of at least two of the following distinct error states occurs:
a high error rate where an MSB of a memory word has an error rate in the range of 2% to 15%, or approximately 10%;
a moderate error rate where an MSB of a memory word has an error rate in the range of 0.5% to 2%, or approximately 1%;
a low error rate where an MSB of a memory word has an error rate in the range of 0.005% to 0.5%, or approximately 0.1%
a nearly error-free error rate where an MSB of a memory word has an error rate less than 0.00034%.

SUMMARY OF THE INVENTION

A static random access memory (SRAM) comprises at least one memory cell array whereby a memory cell array is activated by at least one wordline signal path which is driven by a controller. The memory cell array has output bitlines where each activated memory cell asserts output data through the bitlines to an input/output (IO) driver, which provides the output data to an output port of the SRAM. The controller is configured to modify a pulse width of the at least one wordline signal until a particular output error rate is reached, where the output error rate may be selected to fall into at least two and preferably four or more ranges, such as a high error rate of approximately 10% error rate for an MSB of a memory cell, a medium error rate of approximately 1% for an MSB of a memory cell, approximately 0.1% for an MSB of a memory cell, and a nearly error-free rate which may be defined as less than six sigma (corresponding to an error rate less than 0.00034). In one example of the invention, the memory cell array is configured such that a wordline signal has a shortest path length from a controller source to a memory cell column for a low memory address such as 0x0000 (0x prefix indicating hexadecimal notation), and a longest path length for a high memory address such as 0xFFFF for a 64K 32 bit word memory of the present examples. In another example of the invention, the activation of a memory cell by the wordline signal results in the memory cell providing a plurality of bitlines carrying the memory cell output data, where the memory bits are assigned such that a wordline path length for an MSB of a respective word is shorter than a wordline path length for a corresponding less significant bit of the same memory word.

A wordline routing area distributes wordline signals from the controller generating a wordline signal having a variable pulse width, such that the pulse width of an activation signal carried by the wordline signal can be shortened to reduce power consumption of the memory in exchange for increased error rate, and the controller generating the wordline signal can be configured to provide a high error rate, a medium error rate, a low error rate, or nearly error free operation in exchange for memory speed and power consumption. A calibration routine is provided which enables the association of a wordline signal pulse width for each of the associated error rates.

BRIEF DESCRIPTION OF THE DRAWINGS

FIG. 2 is a plot for a wordline waveform for a low address and short wordline length showing a comparison between a wordline waveform for a high address and long wordline length.

FIG. 3 is a plot of wordline signal path delay vs address which includes a bitline signal path delay associated with bit position for each memory address.

FIG. 4 provides examples for four error rates which may be associated with wordline signal active width and example applications for the associated error rates.

DETAILED DESCRIPTION OF THE INVENTION

In the present application, like reference numbers refer to like structures. References to "approximately" a nominal value are understood to be in the range of ⅕th of the nominal value to 5× the nominal value. References to "on the order of" a nominal value are understood to be in the range of ¹⁄₁₀th of the nominal value to 10× the nominal value. Other values such as 200 ps wordline delay over address ranges and 20 ps wordline delay across data bits are for example use only, and depend on the address and data size of the memory, as well as physical layout.

Figure 1A:
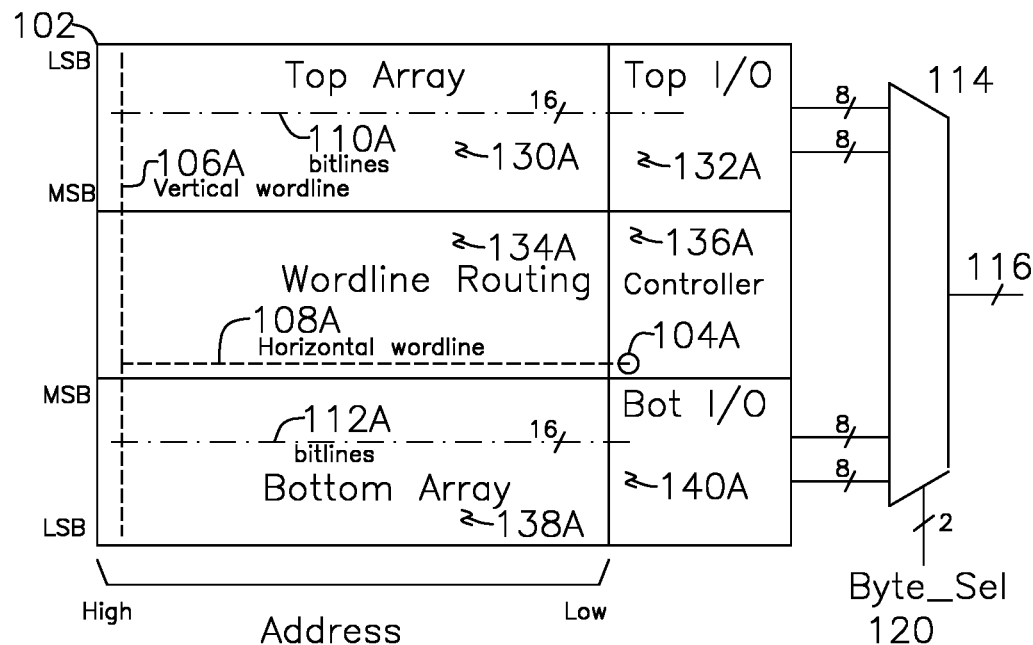
FIG. 1A is a plan view of a memory cell array with IO, controller, and wordline routing area, showing a longest wordline signal path.

FIG. 1A shows an example memory cell array 102 in an example chip layout, where a top memory cell array 130A and a bottom memory cell array 138A each comprise columns of SRAM memory cells. Each memory cell in the top or bottom memory cell arrays is arranged by sequential address in sequential columns, and each address corresponds to a column which is activated by a respective wordline driven by controller 136A, with the wordline signal from the controller 136 carried by a wordline comprising a horizontal wordline leading to a corresponding vertical wordline to the respective memory cell column. Each column of memory cells of the top and bottom memory cell arrays is activated by a particular wordline, and the output of the activated column of memory cells drives a plurality of bitlines, which deliver associated output data from the column of memory cells to either top I/O drivers 132A or bottom I/O drivers 140A, which deliver data shown as being divided into 8 bit bytes to multiplexer 114 which may provide the output data in selectable bytes as data output 116. The wordlines are driven by the controller 136A.

Figure 1B:
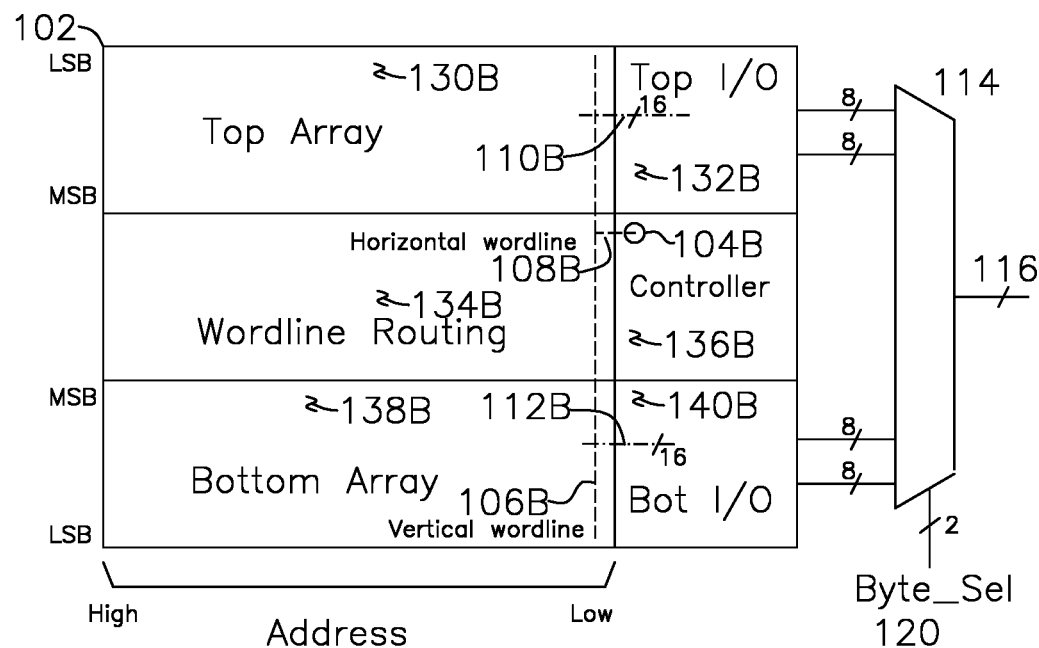
FIG. 1B is a plan view of a memory cell array with IO, controller, and wordline routing area, showing a shortest wordline signal path.

FIG. 1A shows an example longest wordline signal path for a high address such as 0xFFFF, and FIG. 1B shows an example shortest wordline signal path for a low address such as 0x000. In the longest wordline signal path example of FIG. 1A, controller output signal 104A drives horizontal wordline 108A to vertical wordline 106A which connects to the high address memory column in each the top array and the bottom array furthest from the controller output 104A, with vertical wordline 106A transferring the memory column enable signal to a corresponding column of memory cells, the outputs of which are shown as an example 32 bits (four bytes) as two bytes from each of the top and bottom memory arrays. The top memory array cells drive bitlines 110A and the bottom memory array cells drive bitlines 112A. The data bits for a column in each of the top and bottom arrays are arranged with the MSB of the respective column being closest to the controller 136 (closest to wordline routing area 134A) and the less significant bits of the respective column being furthest from the controller 136A (furthest from the wordline routing area 134A) such that the more significant bits of a column have a shorter wordline signal path than that of the less significant bits of a column or word. Accordingly, the MSB of a column has an incrementally shorter wordline path than the wordline path of an LSB of the column for any given memory address. FIG. 1B shows a shortest wordline signal path example for a low value address, where controller output at 104B drives comparatively short combined horizontal wordline 108B and vertical wordline 106B to each of the top and bottom arrays corresponding to a respective column of low value address memory cells. The outputs of the memory cells are transferred via bitlines 110B and 112B to top I/O drivers 132B and bottom I/O drivers 140B, respectively, which drive the example 32 bit output mux 114 for byte selection 120, as was also shown in FIG. 1A.

FIG. 2 shows an example plot of waveform 210 corresponding to a wordline signal as delivered to a low value address memory cell (such as one close to controller 136B of FIG. 1B), where wordline signal waveform 210 with a shortest wordline signal path length from controller 136B to the memory cell array has comparatively fast risetimes 220 and a pulse width 203 from turn on 202 to turn off 204. Waveform 212 shows an example plot of the wordline signal received by a distant memory cell associated with a high address value, and longest wordline signal path length such as shown in FIG. 1A, where the slew rate 222 is reduced from the RC time constant of the incrementally longer wordline path length and constant drive current from the controller to the wordline signal path, resulting in reduced activation duration 207 from turn on 206 to turn off 208. The reduced activation time 207 for a remote (high address value farther from controller 136A shown in FIG. 1A) memory cell column compared to a nearby (low address value closer to controller 136B shown in FIG. 1B) memory cell with comparatively longer activation time 203 means that the selection of the wordline pulse width (activation duration) for the memory would be governed by worst case pulse width 207 for error-free operation, and pulse width 203 would be correspondingly greater, while causing unnecessary incremental power consumption but little other benefit.

FIG. 3 shows a plot 304 of an example wordline signal path delay time 314 vs accessed memory address 316 from a word having a low address to a word having a high address. Plot 304 is trapezoidal to show also the variation in access time associated with an MSB 306 compared to an LSB 308 for each given memory address where the bit position adds to the incremental delay associated with wordline length to reach a memory cell location, corresponding to the MLB/LSB signal bitline paths of FIGS. 1A and 1B. The line 304 passing through LSB point 308 may represent the incrementally longer wordline signal path delays for the LSB of the address range, where the lower wordline delays of the line passing through points 302, 306, and 310 may represent the incrementally shorter vertical wordline signal delays for memory cells closer to the MSB of the address range, with the other intermediate data bits being linearly arranged vertically according to bit significance and vertical wordline signal delay. Note from the layout of FIGS. 1A and 1B that for two 16 bit words, data is arranged as two 16 bit values, wherein one has value b0 as its LSB and b15 as its MSB and the other has b16 as its LSB and b31 as its MSB with b0 and b16 as "LSB" and b15 and b31 as "MSB" by position. In this example bit arrangement, the data bits are arranged by wordline signal path length, such that the column of [b31:b0] in memory array 102 is physically arranged with most significant bits of each 16 bit word closest to controller 136A and least significant bits the furthest from controller 136A. One such example memory array bit arrangement of top array 130A with MSB closest to controller 136A is [b0 b1 b2 b3 b4 b5 b6 b7 b8 b9 b10 b11 b12 b13 b14 b15] and for bottom array 130B arranged with increasing distance from controller is [b31 b30 b29 b28 b27 b26 b25 b24 b23 b22 b21 b20 b19 b18 b17 b16] with b31 and b15 of each arrangement having shortest wordline signal path distance for each 16 bit word. In this example bit arrangement, b31 from the top array 130A and b15 from lower the bottom array 138A have shortest wordline signal path distances, and b16 from the top array 130A and b0 from lower the bottom array 138A have longest wordline signal path distances from controller 136A to the respective memory cell source to IO 132A and 140A, respectively, as shown in FIGS. 1A and 1B. As a result, the more significant bits of each 16 bit word in each of the top and bottom arrays is arranged relatively closer to the controller 136A than are the less significant bits of the respective word, and the bitlines increase in length from a low address to a comparatively higher address.

FIG. 4 shows four example cases for error rates, case 1 being a high error rate such as 10% MSB error rate for training neural network data with a large dataset, case 2 being a moderate MSB bit error rate, such as forming neural network inferences from an audio data stream or noisy image data, case 3 being a low MSB bit error rate, or alternatively a bit error rate where the MSB has no bit errors and where only LSB errors are acceptable (such as training on the standard National Institute for Standards ImageNet dataset available at NIST.gov), and case 4 where virtually no errors are tolerable on any bits (nearly error-free error rate), such as a six sigma error rate of less than 0.00034%.

Figure 5:
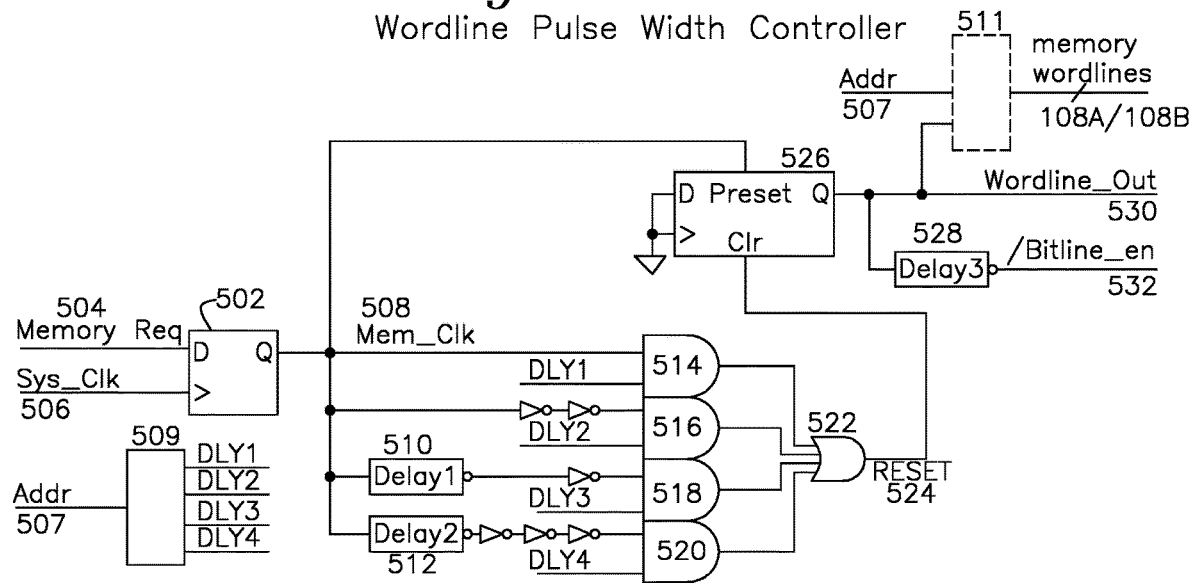
FIG. 5 is a schematic diagram example for a wordline pulse width controller having four selectable wordline pulse widths.
Figure 6:
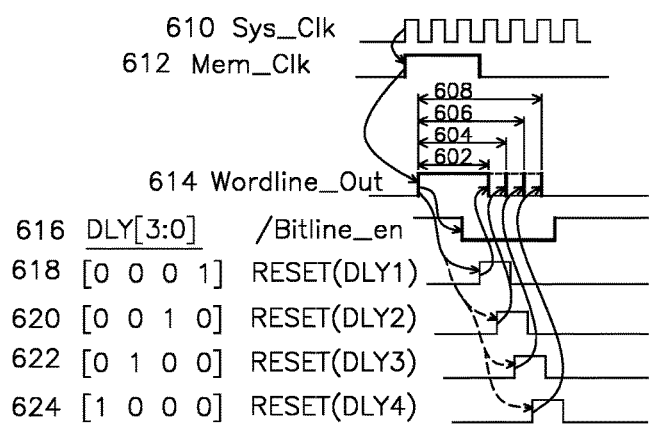
FIG. 6 are waveform plots for the four selectable wordline pulse widths of FIG. 5.

FIG. 5 shows an example wordline pulse width controller with associated waveforms shown in FIG. 6. A system clock 506 and memory request 504 may generate a Mem_Clk 508 signal from the assertion of a memory request 504, and MEM CLK 508 presets D flip flop 526 to assert wordline out 530. The Mem Clk 508 signal also is fed to AND gates 514, 516, 518, 520, each of which is individually enabled by delay select lines DLY1, DLY2, DLY3, DLY4, only one of which is asserted at a time, resulting in a variable length reset signal 524 which clears DFF 526 output to 0, de-asserting Wordline Out 530. The assertion of DLY1 has the shortest delay and results in the shortest Wordline Out activation time, and DLY2 assertion enables 516 and results in an incrementally greater delay associated with the two inverters at the input of AND gate 516. DLY3 enables 518 and provides an incrementally greater delay by the combined Delay 1 510 (with inverted output) and gate delay to input of AND gate 518, and DLY4 provides the longest delay associated with Delay2 512 plus three inverters driving AND gate 520. Accordingly, DLY4 may be associated with nearly error-free wordline signal pulse width, DLY3 may be associated with low error rate wordline signal pulse width, DLY2 with medium error rate wordline signal pulse width, and DLY1 with a high error rate wordline signal pulse width, according to the reduced wordline signal pulse width (activation time) associated with each, as shown in Wordline Out waveforms and associated DLY values 618, 620, 622, and 624, respectively, resulting in wordline signal pulse width (activation duration) 602, 604, 608, and 610, respectively. FIG. 5 shows the operation for a single wordline 530 for understanding the invention, although it is clear to one skilled in the art that individual wordlines of FIGS. 1A and 1B are selected based on an address, and the individual wordlines 108A/108B are decoded from address 507 such as with address decoder 511, and the delay selections such as DLY1, DLY2, DLY3, DLY4 are also determined by address 507 such as with address decoder 509 as described in FIG. 3.

Figure 7:
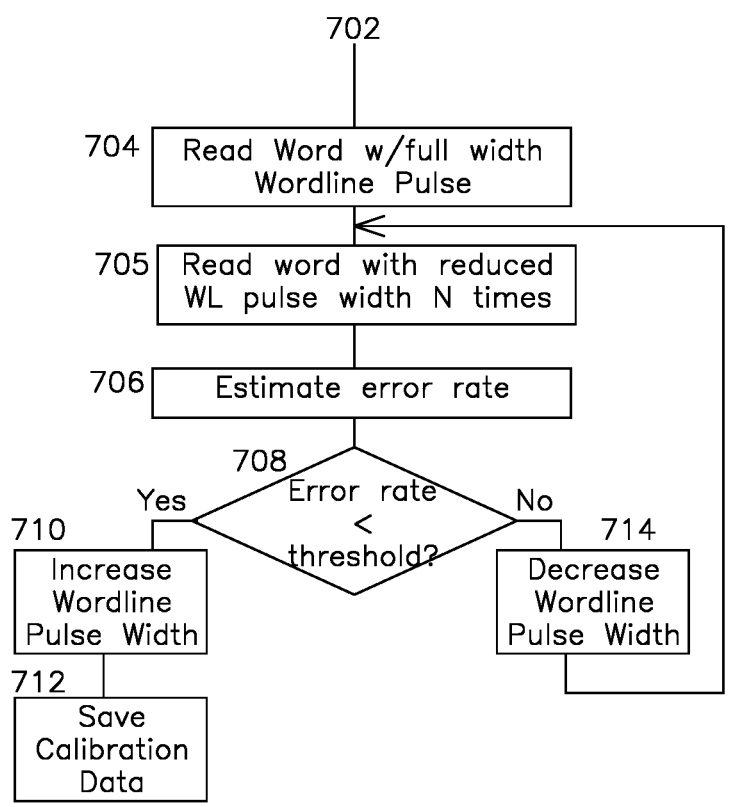
FIG. 7 is a flowchart for calibration of wordline delay with associated wordline pulse widths associated error rates.

FIG. 7 shows an example memory error rate and wordline signal pulse width association flowchart. The wordline signal pulse width may be set to a maximum pulse width upon entry 702 such as DLY4 initially 704, and loop steps 705, 706, 708, and 714 result in the reading N times of a word in step 705 compared to a reference value stored in a controller register, followed by estimating an error rate 706, determining if the error rate for a given DLY value is lower than a threshold value 708, and decreasing the wordline signal pulse width 714 if so (such as by changing from DLY4 to DLY3 or DLY3 to DLY2, etc.), until the DLY[3:0] value associated with lowest pulse width which satisfies a particular error rate is achieved, at which time the pulse width may be optionally incremented by one DLY step for a safety margin to ensure an error rate which is no greater than the desired one, and the DLY value associated with a particular error rate is saved in step 712 for future reference. In this manner, each of the error rates such as the examples of FIG. 4 has an associated DLY value which may be used for the associated data types of FIG. 4.

In another example of the invention, the error rates for a particular DLY value may increase with address value, since a fixed DLY value is associated with a particular data type. In this example, data associated with a lower error rate may be stored in low addresses and data associated with high error rates may be stored in high addresses. Similarly, it is preferable to arrange memory cells to have a shortest wordline signal path for the MSB and incrementally longer wordline signal paths for less significant bits in certain neural network applications, where LSB errors cause fewer inference errors than MSB errors.

The present examples are provided for illustrative purposes only, and are not intended to limit the invention to only the embodiments shown.

We claim:

1. A memory device comprising:
a wordline controller configured to activate a wordline signal, the wordline controller causing a pulse width of the activated wordline signal to be associated with one of at least two data retrieval error rates;
at least one memory array arranged as a sequence of columns of data, each column of data activated by a wordline, the activated wordline causing data to be asserted to bitlines coupled to an input/output driver;
the wordline controller decoding an address to activate a corresponding wordline associated with a column of data in the memory array, the activated wordline held active for a pulse width based on a desired data error rate;
the column of data in the memory array transferred through the bitlines to an output of the memory device, the controller selecting the pulse width corresponding to the one of at least two data retrieval error rates.

2. The memory device of claim 1 where the at least one memory array comprises a top memory cell array and a bottom memory cell array.

3. The memory device of claim 1 where the at least one memory array is configured to provide a high value address in a location which has a greater separation distance from the wordline controller than a low value address.

4. The memory device of claim 1 where the at least one memory array is configured to have a wordline length which is shorter for a most significant bit (MSB) than a least significant bit (LSB) for a column of data.

5. The memory device of claim 1 where the bitlines provide multiples of 8 bits of data.

6. The memory device of claim 1 where the bitlines provide 32 bits of data arranged as four eight bit bytes which are individually selectable as output data.

7. The memory device of claim 1 where the at least two error rates include error rates of approximately 10% MSB errors, approximately 1% MSB errors, approximately 0.1% MSB errors, and less than 0.00034% MSB errors.

8. The memory device of claim 7 where for a given error rate and a given address, an error rate for a more significant bit is less than a corresponding error rate for a lower significant bit.

9. The memory device of claim 1 where the at least two error rates are a high error rate of 2% to 15% MSB error rate, a medium error rate of 0.5% to 2% MSB error rate, a low error rate of 0.005% to 0.5%, and an error free rate of less than 0.00034% error rate.

10. A memory array comprising:
a top memory cell array accessed by activating a wordline which causes the top memory cell array to output data onto one or more top bitlines;
a bottom memory cell array accessed by activating a wordline which causes the bottom memory cell array to output data onto one or more bottom bitlines;
a wordline controller configured to examine output data from the top bitlines and/or the bottom bitlines, the wordline controller modifying a wordline signal pulse width until at least one of the following four error states occurs:
a high error rate where an MSB of a memory word has an error rate in the range of 2% to 15%, or approximately 10%;
a moderate error rate where an MSB of a memory word has an error rate in the range of 0.5% to 2%, or approximately 1%;
a low error rate where an MSB of a memory word has an error rate in the range of 0.005% to 0.5%, or approximately 0.1%; and
a nearly error-free error rate where an MSB of a memory word has an error rate less than 0.00034%.

11. The memory device of claim 10 where the at least one memory array is configured to provide data from a high value address having a greater error rate than data from a low value address.

12. The memory device of claim 10 where the at least one memory array is configured to have a wordline path length which is shorter for a more significant bit than for a less significant bit for a column of the at least one memory array.

13. The memory device of claim 10 where the bitlines provide multiples of 8 bits of data.

14. The memory device of claim 10 where the bitlines provide 32 bits of data arranged as four eight bit bytes which are individually selectable as output data.

15. The memory device of claim 10 where the at least two error rates include error rates of approximately 10% MSB errors, approximately 1% MSB errors, approximately 0.1% MSB errors, and less than 0.00034% MSB errors.

16. The memory device of claim 15 where for a given error rate and a given address, an MSB error rate is less than a corresponding LSB error rate.

17. The memory device of claim 10 where the at least two error rates are a high error rate of 2% to 15% MSB error rate, a medium error rate of 0.5% to 2% MSB error rate, a low error rate of 0.005% to 0.5%, and an error free rate of less than 0.00034% error rate.

* * * * *